(12) United States Patent
Hokazono

(10) Patent No.: US 8,134,159 B2
(45) Date of Patent: Mar. 13, 2012

(54) SEMICONDUCTOR DEVICE INCLUDING A P-TYPE TRANSISTOR HAVING EXTENSION REGIONS IN SOURS AND DRAIN REGIONS AND METHOD OF FABRICATING THE SAME

(75) Inventor: Akira Hokazono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 12/481,981

(22) Filed: Jun. 10, 2009

(65) Prior Publication Data

US 2010/0181625 A1 Jul. 22, 2010

(30) Foreign Application Priority Data

Jan. 22, 2009 (JP) .................................. 2009-11768

(51) Int. Cl.
*H01L 29/76* (2006.01)
(52) U.S. Cl. ...... 257/77; 257/65; 257/607; 257/E21.054; 438/931
(58) Field of Classification Search .................... 257/77, 257/65, 607, E21.054
See application file for complete search history.

(56) References Cited

U.S. PATENT DOCUMENTS

| | | | | |
|---|---|---|---|---|
| 6,271,551 B1 * | 8/2001 | Schmitz et al. | ............... | 257/288 |
| 7,491,988 B2 * | 2/2009 | Tolchinsky et al. | ........... | 257/289 |
| 7,883,977 B2 * | 2/2011 | Babcock et al. | .............. | 438/289 |

OTHER PUBLICATIONS

O. Weber, et al., "Towards an Understanding of Electrically Active Carbon Interstitial Defects in $Si_{1-y}C_y$ Buried Channel n-MOSFETs", ESSDERC 2003, 2003, pp. 271-274.
Hong-Jyh Li, et al. "The Pile-Ups of Aluminum and Boron in the Sige (C)", Mat. Res. Soc. Symp. Proc., vol. 737, 2003, pp. 643-648.
F. Ducroquet, et al., "Double SiGe:C Diffusion Barrier Channel 40nm CMOS with Improved Short-Channel Performances", IEDM Technical Digest, 2004, 4 pages.

* cited by examiner

*Primary Examiner* — Eugene Lee
(74) *Attorney, Agent, or Firm* — Oblon, Spivak, McClelland, Maier & Neustadt, L.L.P.

(57) ABSTRACT

A semiconductor device according to one embodiment includes: a semiconductor layer formed on a semiconductor substrate; a gate electrode formed on the semiconductor layer via a gate insulating film; an impurity diffusion suppression layer formed between the semiconductor substrate and the semiconductor layer and including a C-containing Si-based crystal containing a first impurity, the C-containing Si-based crystal being configured to suppress diffusion of a second impurity having a p-type conductivity type, and the C-containing Si-based crystal with the first impurity having a function of suppressing generation of fixed charge in the C-containing Si-based crystal; and p-type source/drain regions formed in the semiconductor substrate, the impurity diffusion suppression layer and the semiconductor layer in sides of the gate electrode, the p-type source/drain region having an extension region in the semiconductor layer and containing the second impurity.

20 Claims, 12 Drawing Sheets (a)

(b)

(c)

SEMICONDUCTOR DEVICE INCLUDING A P-TYPE TRANSISTOR HAVING EXTENSION REGIONS IN SOURS AND DRAIN REGIONS AND METHOD OF FABRICATING THE SAME

CROSS-REFERENCE TO RELATED APPLICATIONS

This application is based upon and claims the benefit of priority from prior Japanese Patent Application No. 2009-011768, filed on Jan. 22, 2009, the entire contents of which are incorporated herein by reference.

BACKGROUND

A conventional n-type transistor structure is known in which a layer made of Si:C or SiGe:C, etc., is formed on a region having B (boron) as a channel impurity diffused therein and a Si film into which an impurity is not implanted intentionally is formed thereon. This structure, for example, is disclosed in non-patent literary documents of Hong-Jyh Li et al., "Mat. Res. Soc. Symp. Proc.", vol. 737, p. 643, 2003 and F. Ducroquet et al., "2004 IEDM Technical Digest.", p. 437.

According to an n-type transistor described in the non-patent literary documents, since diffusion of B is suppressed in a Si:C layer, diffusion of B into the Si film is suppressed in a channel region, and it is thereby possible to form a channel region having a steep impurity concentration distribution.

BRIEF SUMMARY

A semiconductor device according to one embodiment includes: a semiconductor layer formed on a semiconductor substrate; a gate electrode formed on the semiconductor layer via a gate insulating film; an impurity diffusion suppression layer formed between the semiconductor substrate and the semiconductor layer and including a C-containing Si-based crystal containing a first impurity, the C-containing Si-based crystal being configured to suppress diffusion of a second impurity having a p-type conductivity type, and the C-containing Si-based crystal with the first impurity having a function of suppressing generation of fixed charge in the C-containing Si-based crystal; and p-type source/drain regions formed in the semiconductor substrate, the impurity diffusion suppression layer and the semiconductor layer in sides of the gate electrode, the p-type source/drain region having an extension region in the semiconductor layer and containing the second impurity.

A semiconductor device according to another embodiment includes: a semiconductor substrate having p-type and n-type transistor regions; a first semiconductor layer formed on the semiconductor substrate in the p-type transistor region; a first gate electrode formed on the first semiconductor layer via a first insulating film; an first impurity diffusion suppression layer formed between the semiconductor substrate and the first semiconductor layer and comprising a C-containing Si-based crystal containing a first impurity, the C-containing Si-based crystal being configured to suppress diffusion of a second impurity having a p-type conductivity type, and the C-containing Si-based crystal with the first impurity having a function of suppressing generation of fixed charge in the C-containing Si-based crystal; p-type source/drain regions formed in the semiconductor substrate in the p-type transistor region, the first impurity diffusion suppression layer and the first semiconductor layer in sides of the first gate electrode, the p-type source/drain region having an extension region in the first semiconductor layer and containing the second impurity; an n-type channel region formed between the p-type source/drain regions; a second semiconductor layer formed on the semiconductor substrate in the n-type transistor region; a second gate electrode formed on the second semiconductor layer via a second insulating film; an second impurity diffusion suppression layer formed between the semiconductor substrate and the second semiconductor layer, and comprising a C-containing Si-based crystal containing the first impurity; n-type source/drain regions formed in the semiconductor substrate in the n-type transistor region, the second impurity diffusion suppression layer and the second semiconductor layer in sides of the second gate electrode; and a p-type channel region formed between the n-type source/drain regions and containing the second impurity, a concentration of the second impurity of the p-type channel region in a region above the second impurity diffusion suppression layer being smaller than that in a region under the second impurity diffusion suppression layer.

A method of fabricating a semiconductor device according to another embodiment includes: forming an impurity supply layer containing a first impurity on a base layer, an impurity diffusion suppression layer comprising a C-containing Si-based crystal on the impurity supply layer and a semiconductor layer on the impurity diffusion suppression layer, the C-containing Si-based crystal being configured to suppress diffusion of a second impurity having a p-type conductivity type, and the C-containing Si-based crystal with the first impurity having a function of suppressing generation of fixed charge in the C-containing Si-based crystal; diffusing the first impurity contained in the impurity supply layer into the impurity diffusion suppression layer; forming a gate electrode on the semiconductor layer via a gate insulating film; forming extension regions of the p-type source/drain regions containing the second impurity in the semiconductor layer in sides of the gate electrode; and forming deep regions of the p-type source/drain regions in the base layer, the impurity diffusion suppression layer and the semiconductor layer on the both sides of the gate electrode.

DETAILED DESCRIPTION

First Embodiment

Figure 1:
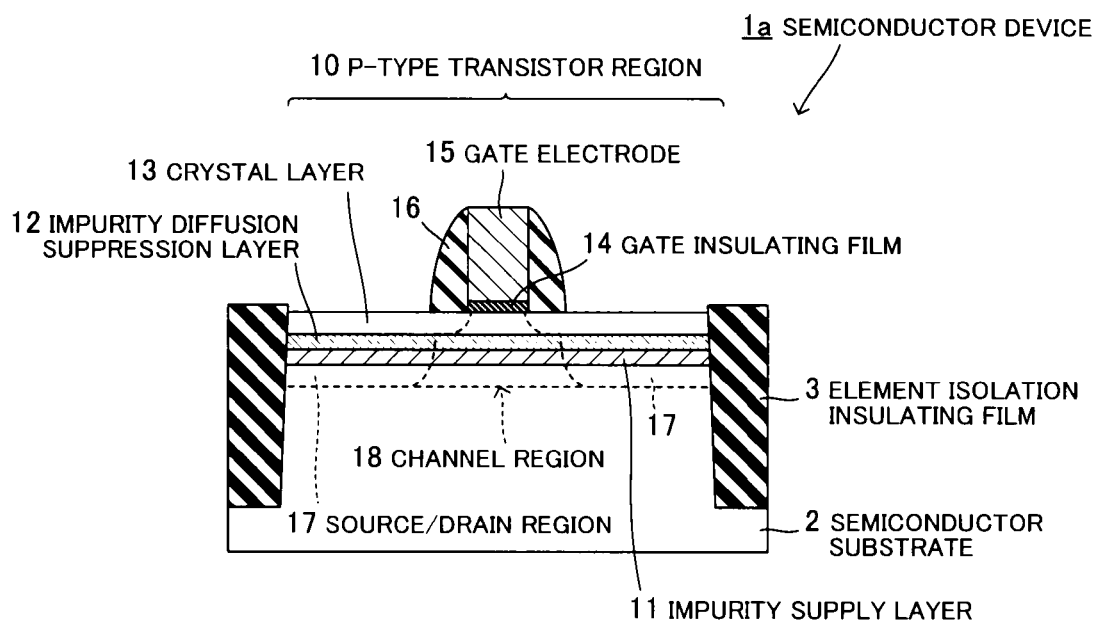
FIG. 1 is a cross sectional view showing a semiconductor device according to a first embodiment.

FIG. 1 is a cross sectional view showing a semiconductor device 1a according to a first embodiment. In addition, FIG. 2 is a partial cross sectional view showing a periphery of a channel region 18 in a p-type transistor region 10 of the semiconductor device 1a.

A semiconductor device 1a according to the present embodiment has a p-type transistor region 10 on a semiconductor substrate 2. The p-type transistor region 10 is isolated from other element regions by an element isolation insulating film 3.

The p-type transistor region 10 includes an impurity supply layer 11 formed on the semiconductor substrate 2, an impurity diffusion suppression layer 12 formed on the impurity supply layer 11, a crystal layer 13 formed on the impurity diffusion suppression layer 12, a gate electrode 15 formed on the crystal layer 13 via a gate insulating film 14, gate sidewalls 16 formed on side faces of the gate electrode 15, source/drain regions 17 formed in the semiconductor substrate 2, the impurity supply layer 11, the impurity diffusion suppression layer 12 and the crystal layer 13 in both sides of the gate electrode 15, and a channel region 18 formed between the source/drain regions 17.

A Si-based substrate such as a Si substrate, etc., is used for the semiconductor substrate 2.

The element isolation insulating film 3 is made of an insulating material such as $SiO_2$, etc., and has a STI (Shallow Trench Isolation) structure having, e.g., a depth of 200-300 nm.

The source/drain region 17 (and an extension region 17e thereof) contains a p-type impurity such as B, etc. In addition, a metal silicide layer containing a metal such as Ni, Co, Er, Pt or Pd, etc., may be formed on an upper surface of the crystal layer 13 having the source/drain region 17 formed therein.

The channel region 18 in the p-type transistor region 10 contains an n-type impurity such as As, etc., which is implanted for a threshold voltage adjustment, etc.

The impurity diffusion suppression layer 12 has a property such that diffusion of the p-type impurity such as B, etc., contained in the source/drain region 17 is suppressed inside the impurity diffusion suppression layer 12. Therefore, diffusion of the p-type impurity contained in the extension region 17e located on the impurity diffusion suppression layer 12 into a lower layer than the extension region 17e is suppressed by the impurity diffusion suppression layer 12, and it is thereby possible to maintain an impurity concentration profile of the extension region 17e to be shallow and steep.

The impurity diffusion suppression layer 12 is made of a material in which an impurity such as B, N or F, etc., is introduced into a C-containing Si-based crystal such as Si:C or SiGe:C, etc., having a property such that B contained in the source/drain region 17 is less likely to diffuse inside the impurity diffusion suppression layer 12. In addition, the impurity diffusion suppression layer 12 has a thickness of, e,g., 2-10 nm.

Note that, when the impurity diffusion suppression layer 12 is made of a Si:C crystal, a C concentration is preferably 0.05-3 At %. When the C concentration of the Si:C crystal is less than 0.05 At %, a function of suppressing diffusion of B may be insufficient, and when exceeding 3 At %, there may be a possibility that operating characteristics of the transistor deteriorates. This is because, since an interstitial distance of the Si:C decreases with increase in the C concentration, a defect may be generated in the crystal layer 13 due to a difference in lattice constant between the crystal layer 13 as an upper layer and the impurity diffusion suppression layer 12.

In addition, a fixed charge is generated in Si:C or SiGe:C when a Si:C or SiGe:C layer is formed in a channel region. The impurity diffusion suppression layer 12 contains an impurity such as B, N or F, etc., (hereinafter referred to as "suppression impurity") in order to suppress generation of the fixed charge. By using Si:C or SiGe having the suppression impurity introduced thereinto as a material of the impurity diffusion suppression layer 12, it is possible to suppress the generation of the fixed charge inside the impurity diffusion suppression layer 12. Note that, a suppression impurity concentration in the impurity diffusion suppression layer 12 is preferably $5.0\times10^{17}$ At/cm$^{-2}$ or more in order to effectively suppress the generation of the fixed charge.

In addition, as for a suppression impurity concentration distribution in the impurity diffusion suppression layer 12, a peak thereof is preferably below middle of the impurity diffusion suppression layer 12 in a thickness direction. This is because the suppression impurity in the impurity diffusion suppression layer 12 becomes less likely to diffuse into the channel region 18.

The impurity supply layer 11 is made of a Si-based crystal containing a suppression impurity. The suppression impurity contained in the impurity diffusion suppression layer 12 is supplied from the impurity supply layer 11 in a process of fabricating the semiconductor device 1a. Here, since the impurity supply layer 11 is located under the impurity diffusion suppression layer 12, the suppression impurity is supplied from the lower portion of the impurity diffusion suppression layer 12, thus, a peak of the suppression impurity concentration distribution in the impurity diffusion suppression layer 12 can be set below the middle of the impurity diffusion suppression layer 12 in the thickness direction. The generation of the fixed charge in the impurity diffusion suppression layer 12 can be suppressed even in the case that the impurity supply layer 11 is located above the impurity diffusion suppression layer 12, however, the suppression impurity in the impurity diffusion suppression layer 12 is more likely to diffuse into the channel region 18 compared with the case that the impurity supply layer 11 is located under the impurity diffusion suppression layer 12.

Note that, when B is contained the source/drain region 17, B is supplied to the impurity diffusion suppression layer 12 also from the source/drain region 17 but is not supplied to a region not adjacent to the source/drain region 17 (a region adjacent to the channel region 18 below the gate electrode 15) hence, the impurity supply layer 11 is required.

Figure 2A:
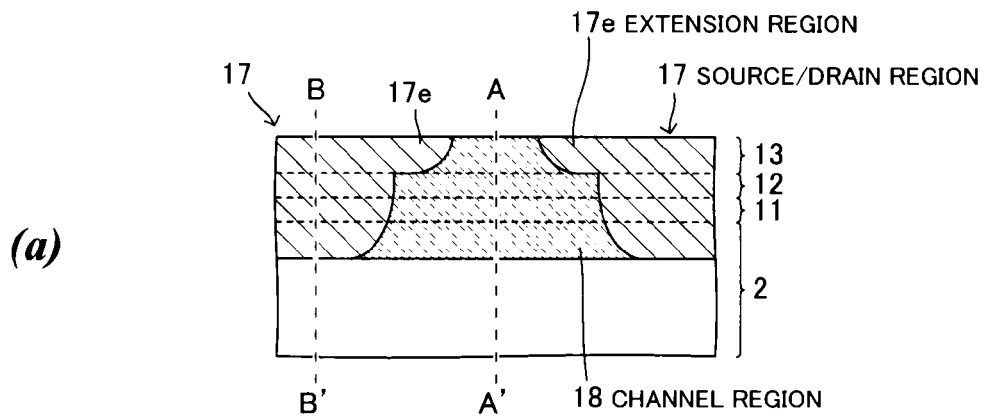
FIG. 2 is a partial cross sectional view showing a periphery of a channel region in a p-type transistor region of the semiconductor device according to the first embodiment.
Figure 2A:
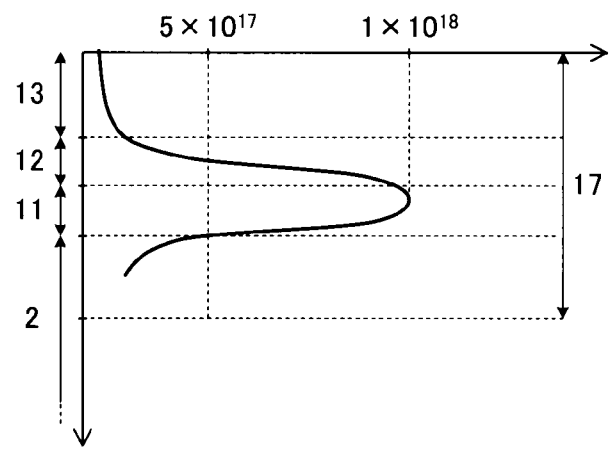
Figure 2A:
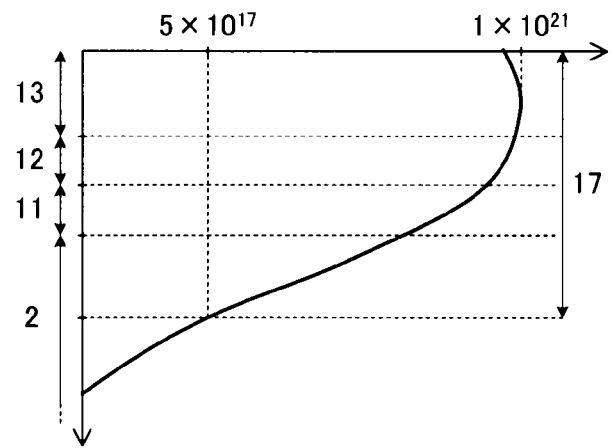

FIG. 2A(b) is an impurity distribution diagram taken along line A-A' in FIG. 2A(a). FIG. 2A(c) is an impurity distribution diagram taken along line B-B' in FIG. 2A(a). The horizontal axis is an impurity concentration, and the vertical axis is a position (depth). In the FIGS. 2A(a), 2A(b), 2A(c), the suppression impurity and the impurity of the source/drain region 17 is are same, for example, B.

As shown in FIG. 2A(b), an impurity distribution below the gate electrode 15 has a peak in the impurity supply layer 11. The peak concentration is $1.0\times10^{18}$ cm$^{-2}$.

A maximum concentration in the impurity diffusion suppression layer 12 is provided in a boundary between the impurity supply layer 11 and the impurity diffusion suppression layer 12.

As shown in FIG. 2A(c), an impurity distribution in the source/drain region 17 has a peak in the crystal layer 13. In FIG. 2A(c), the impurity distribution of the suppression impurity and the source/drain impurity are shown in a single curve, since the suppression impurity and the source/drain impurity are the same.

The impurity concentration in and below the impurity diffusion suppression layer 12 is lower than the peak concentration in the crystal layer 13.

Figure 2B:
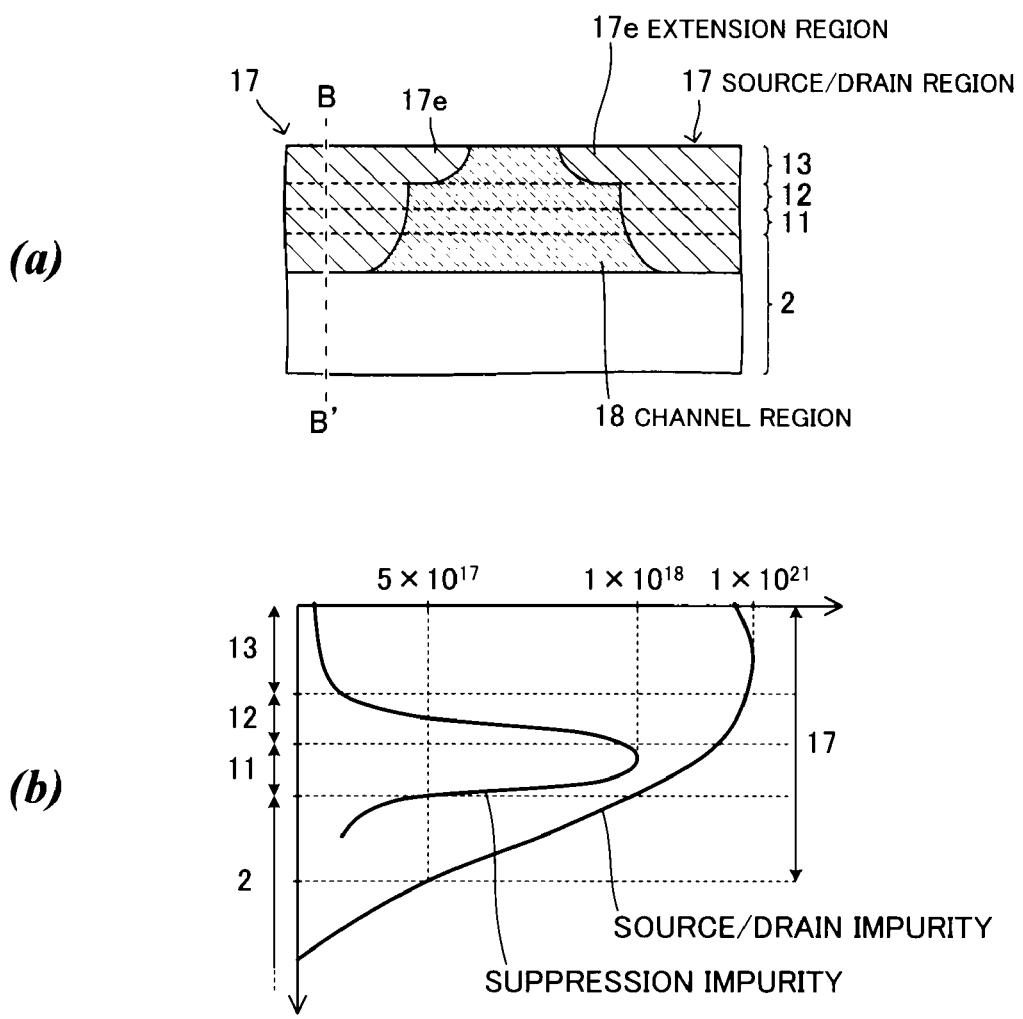

FIG. 2B(c) is an impurity distribution diagram taken along line B-B' in FIG. 2B(a). In this case, a suppression impurity and a source/drain impurity are not same. The suppression impurity distribution in the source/drain region 17 is substantially same as the impurity distribution shown in FIG. 2A(c). The source/drain impurity distribution in the source/drain region 17 is substantially same as the impurity distribution shown in FIG. 2A(b).

In the case the suppression impurity is different from the impurity of the source/drain, the suppression impurity has a peak in the impurity supply layer 11 even in the source/drain region 17.

Note that, it is considered that the generation of the fixed charge in Si:C or SiGe:C is caused because C entered interstitial regions in a Si crystal traps charge in Si:C or SiGe:C. In addition, it is considered that an impurity such as B, N or F, etc., suppresses the generation of the fixed charge since these impurities are combined with C in the interstitial regions in the Si crystal. Thus, as for the impurity contained in the impurity supply layer 11, it is possible to use an impurity such as B, N or F, etc., which has an atomic radius small enough to enter interstitial regions in a Si-based crystal such as a Si crystal or a SiGe crystal, etc., and has a property of combining with C.

The crystal layer 13 is made of a Si-based crystal such as a Si crystal, etc., formed by an epitaxial crystal growth method using the impurity diffusion suppression layer 12 as a base. In addition, the crystal layer 13 has a thickness of, e.g., 5-15 nm.

The gate insulating film 14 is made of, e.g., an insulating material such as $SiO_2$, SiN or SiON, etc. In addition, the gate insulating film 14 has a thickness of, e.g., 0.5-6 nm.

The gate electrode 15 is made of, e.g., a Si-based polycrystal such as polycrystalline silicon, etc., containing a conductivity type impurity. As for the conductivity type impurity, As or P, etc., is used as n-type impurity and B or $BF_2$, etc., is used as p-type impurity. In addition, a silicide layer containing a metal such as Ni, Co, Er, Pt or Pd, etc., may be formed on an upper surface of the gate electrode 15. In addition, the gate electrode 15 has a thickness of, e.g., 50-200 nm.

The gate sidewall 16 is made of, e.g., an insulating material such as SiN, etc. Alternatively, the gate sidewall 16 may have a structure of two layers made of multiple types of insulating materials comprising SiN, $SiO_2$ or TEOS (Tetraethoxysilane), etc., furthermore, it may have a structure of three or more layers.

Although an example of a method of fabricating a semiconductor device according to the present embodiment will be described hereinafter, it is not limited thereto practically.

FIGS. 3A to 3F are cross sectional views showing processes for fabricating the semiconductor device according to the first embodiment.

Figure 3A:
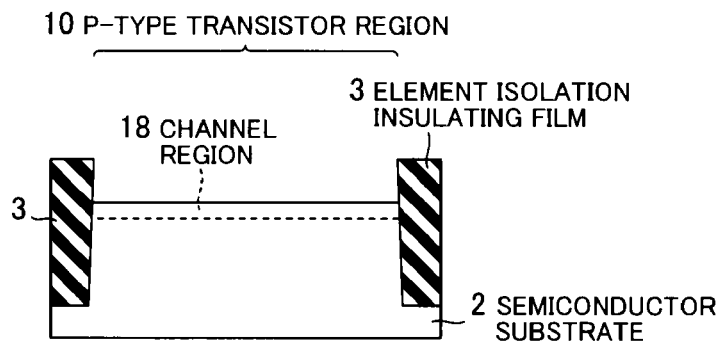
FIGS. 3A to 3F are cross sectional views showing processes for fabricating the semiconductor device according to the first embodiment.

Firstly, as shown in FIG. 3A, the element isolation insulating film 3 is formed in the semiconductor substrate 2 by shallow trench isolation for isolating the p-type transistor region 10 from other elements. Following this, after forming a 10 nm or less thick natural oxide film (not shown), a conductivity type impurity is implanted into a surface of the semiconductor substrate 2 by an ion implantation procedure, which results in that an n-type well (not shown) and the channel region 18 are formed. After that, heat treatment such as RTA (Rapid Thermal Annealing), etc., is performed for activating the conductivity type impurity in the n-type well and the channel region 18.

Here, for example, when the n-type well is formed using P, ion implantation is carried out under a condition at an implantation energy of 500 KeV and an implantation dose of $3.0 \times 10^{13}$ $cm^{-2}$. Meanwhile, when the n-type channel region 18 is formed using As, ion implantation is carried out under a condition at an implantation energy of 80 KeV and an implantation dose of $1.0 \times 10^{13}$ $cm^{-2}$.

Figure 3B:
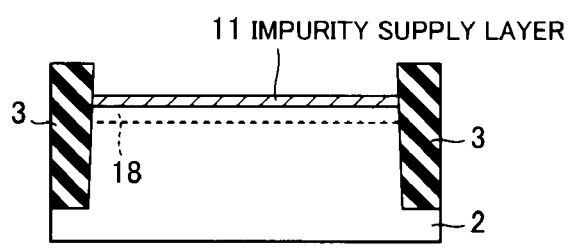

Next, as shown in FIG. 3B, after removing the natural oxide film on the upper surface of the semiconductor substrate 2, the impurity supply layer 11 is formed on the channel region 18 in the p-type transistor region 10.

The impurity supply layer 11 is formed by epitaxially growing a Si crystal using the surface of the semiconductor substrate 2 as a base while performing in-situ doping of an impurity such as B, N or F, etc., which suppresses the generation of the fixed charge in Si:C. This epitaxial crystal growth is carried out, e.g., in a hydrogen atmosphere under high temperature of 700° C. or more.

Here, in order not to generate off-leakage current between the source/drain regions 17, it is necessary to control the implantation dose of the suppression impurity so that the concentration of the suppression impurity remained in the impurity supply layer 11 becomes sufficiently smaller than the concentration of the n-type impurity in the channel region 18.

For example, when a B-doped Si crystal is epitaxially grown as the impurity supply layer 11, for example, a gas which is a raw material for Si such as monosilane ($SiH_4$), dichlorosilane ($SiH_2Cl_2$) or trichlorosilane ($SiHCl_3$), etc., a gas which is a raw material for B such as diborane ($B_2H_6$), etc., and a hydrogen chloride (HCl) gas are used as a reaction gas.

Figure 3C:
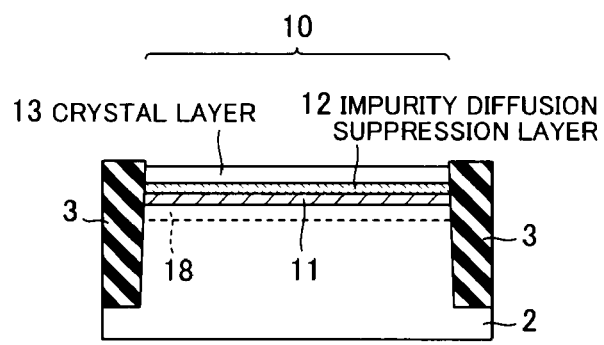

Next, as shown in FIG. 3C, the impurity diffusion suppression layer 12 and the crystal layer 13 are formed on the impurity supply layer 11.

The impurity diffusion suppression layer 12 is formed by epitaxially growing a Si:C crystal, etc., using the impurity supply layer 11 as a base. In addition, the crystal layer 13 is formed by epitaxially growing a Si crystal, etc., using the impurity diffusion suppression layer 12 as a base. Note that, these epitaxial crystal growths are carried out, e.g., in a hydrogen atmosphere under high temperature of 700° C. or more.

For example, when a Si:C crystal is epitaxially grown as the impurity diffusion suppression layer 12, for example, the above-mentioned gas which is a raw material for Si, a gas which is a raw material for C such as acetylene ($C_2H_2$) or monomethylsilane ($SiH_3CH_3$), etc., and a hydrogen chloride (HCl) gas are used as a reaction gas. Note that, the Si:C crystal may be formed by implanting C by a ion implantation procedure, etc., after forming the Si crystal.

Meanwhile, when a Si crystal is epitaxially grown as the crystal layer 13, for example, the above-mentioned gas which is a raw material for Si and a hydrogen chloride (HCl) gas are used as a reaction gas.

Note that, the impurity supply layer 11, the impurity diffusion suppression layer 12 and the crystal layer 13 can be continuously epitaxially grown by switching the reaction gas. After this, the suppression impurity in the impurity supply layer 11 is diffused into the impurity diffusion suppression layer 12 by heat applied in a process of forming an oxide film and a thermal process.

Figure 3D:
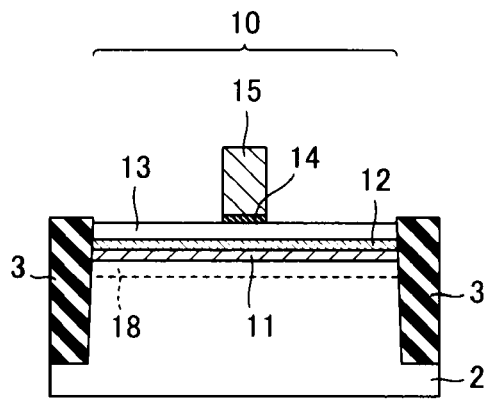

Next, as shown in FIG. 3D, the gate insulating film 14 and the gate electrode 15 are formed on the crystal layer 13.

Here, the gate insulating film 14 and the gate electrode 15 are formed by, e.g., following method. Firstly, a material film of the gate insulating film 14 such as a $SiO_2$ film, etc., is formed on the whole surface of the semiconductor substrate 2 by a thermal oxidation method and a LPCVD (Low-Pressure Chemical Vapor Deposition) method, etc., and a material film of the gate electrode 15 such as a polycrystalline Si film, etc., is formed thereon by the LPCVD method. Next, the material film of the gate electrode 15 is patterned by an optical lithography method, an X-ray lithography method or an electron beam lithography method, etc., and then, the material film of the gate insulating film 14 is further patterned by a RIE (Reactive Ion Etching) method, etc., which results in that the gate insulating film 14 and the gate electrode 15 are obtained.

Figure 3E:
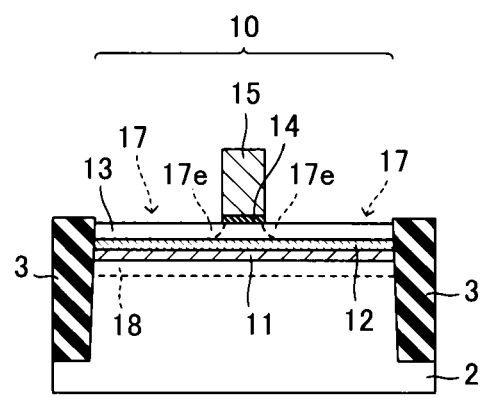

Next, as shown in FIG. 3E, a shallow region of the source/drain region 17 including the extension region 17e is formed in the crystal layer 13.

Here, the shallow region of the source/drain region 17 is formed by, e.g., following method. Firstly, after forming a 1-2 nm thick $SiO_2$ film (not shown) on the surface of the gate electrode 15 by the thermal oxidation method, etc., a material film of an offset spacer (not shown) such as a $SiO_2$ film, etc., is formed thereon in a thickness of 3-12 nm by the LPCVD method, etc. Next, the formed material film of the offset spacer and the $SiO_2$ film are shaped into the offset spacer (not shown) by the RIE method, etc.

Next, a p-type impurity is implanted into the whole surface of the semiconductor substrate 2 by the ion implantation procedure, etc., using the offset spacer and the gate electrode 15 as a mask, which results in that the shallow region of the source/drain region 17 is formed. Concretely, for example, a halo region is formed by implanting As under a condition at an implantation energy of 40 KeV, an implantation dose of $3.0 \times 10^{13}$ cm$^{-2}$ and an implantation angle of 30° (an angle with reference to a direction vertical to the surface of the semiconductor substrate 2), subsequently, the shallow region of the source/drain region 17 is formed by implanting $BF_2$ under a condition at an implantation energy of 1-3 KeV and an implantation dose of $5.0 \times 10^{14}$ to $1.5 \times 10^{15}$ cm$^{-2}$ and heat treatment such as RTA (Rapid Thermal Annealing), etc., is performed for activation.

Here, since the diffusion of B into the lower layer is suppressed by the impurity diffusion suppression layer 12 also when B in the shallow region of the source/drain region 17 (the extension region 17e) is activated by the heat treatment, the impurity concentration profile of the extension region 17e can be maintained to be steep.

Figure 3F:
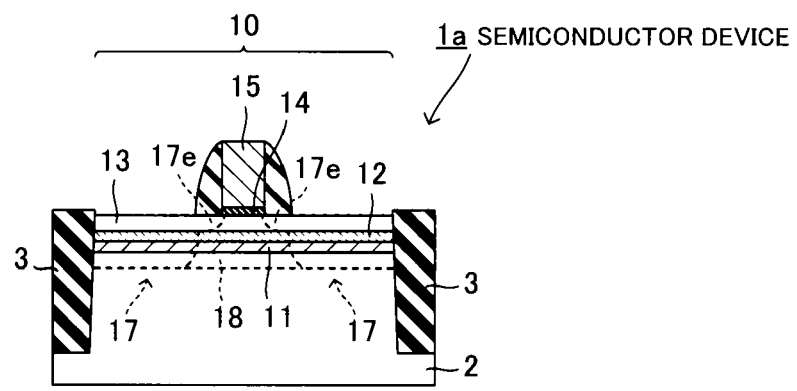

Next, as shown in FIG. 3F, the gate sidewalls 16 are formed on the side faces of the gate electrode 15, and then, a deep high-concentration region of the source/drain region 17 is formed in the semiconductor substrate 2, the impurity supply layer 11, the impurity diffusion suppression layer 12 and the crystal layer 13 in the p-type transistor region 10. As a result, the semiconductor device 1a shown in FIG. 1 is obtained.

Here, the gate sidewall 16 and the deep high-concentration region of the source/drain region 17 are formed by, e.g., following method. Firstly, a material film of the gate sidewall 16 such as a $SiO_2$, etc., is formed so as to cover the gate electrode 15 and the offset spacer (not shown) on the side faces thereof by the LPCVD method, etc., and is shaped into the gate sidewall 16 by the RIE method, etc.

Next, a conductivity type impurity is implanted into the whole surface of the semiconductor substrate 2 by the ion implantation procedure, etc., using the gate sidewall 16 and the gate electrode 15 as a mask, which results in that the deep high-concentration region of the source/drain region 17 is formed. Concretely, for example, the deep high-concentration region of the source/drain region 17 is formed by implanting B under a condition at an implantation energy of 2-5 KeV and an implantation dose of $1.0 \times 10^{15}$ to $5.0 \times 10^{15}$ cm$^{-2}$, and then, the heat treatment such as the RTA, etc., is performed for activation.

Here, since the diffusion of B contained in the shallow region of the source/drain region 17 (the extension region 17e) into the lower layer is suppressed by the impurity diffusion suppression layer 12 also when B in the deep high-concentration region of the source/drain region 17 is activated by the heat treatment, the impurity concentration profile of the extension region 17e can be maintained to be steep.

Note that, a process of epitaxially growing a Si crystal or a SiGe crystal, etc., on the crystal layer 13 may be performed before or after forming the deep high-concentration region of the source/drain region 17.

Note that, after this, a silicide layer may be formed on exposed portions of an upper surface of the gate electrode 15 and an upper surface of the crystal layer 13. Concretely, for example, when a Ni silicide layer is formed as a silicide layer, the Ni silicide layer is formed by following method. Firstly, the natural oxide film on the upper surfaces of the gate electrode 15 and the crystal layer 13 is removed by hydrofluoric acid treatment. Next, after forming a Ni film on the whole surface of the semiconductor substrate 2 by a sputtering method, etc., silicidation reaction is generated between the Ni film and the gate electrode 15 and between the Ni film and the crystal layer 13 by heat treatment such as the RTA, etc., under the temperature condition of 400-500° C., which results in that the silicide layer is formed. Next, an unreacted Ni film is removed using a mixed solution of sulfuric acid and hydrogen peroxide solution.

Note that, when the Ni silicide layer is formed, a process in which a Ni film is formed and a TiN film is subsequently formed thereon, or, a process in which a Ni film is formed and is etched using a mixed solution of sulfuric acid and hydrogen peroxide solution after carrying out the low temperature RTA at 400° C. once and the RTA is carried out again at 400-550° C. for reducing sheet resistance (two step annealing), may be carried out. In addition, Pt may be added to the Ni film.

Furthermore, although it is not shown in the figures, after obtaining the semiconductor device 1a shown in FIG. 1, an insulating film made of TEOS (Tetraethoxysilane), BPSG (B- and P-doped $SiO_2$) or SiN, etc., is deposited on the whole surface of the semiconductor substrate 2, and then is planarized by a CMP (Chemical Mechanical Polishing) method, etc., which results in that an interlayer insulating film is formed. Following this, for example, a contact hole is formed by a photolithography method and the RIE method, then, a material film of a barrier metal such as Ti or TiN, etc., and a material film of the contact plug such as W, etc., are formed so as to fill up the contact hole, and these material films are shaped into a contact plug by applying the CMP, etc. Following this, a metal film is formed on the interlayer insulating film as well as on the contact plug, and is shaped into a wiring by, e.g., the photolithography method and the RIE method.

(Effect of the First Embodiment)

According to the first embodiment, it is possible to suppress the diffusion of the p-type impurity contained in the extension region 17e of the source/drain region 17 into a lower layer by forming the impurity diffusion suppression layer 12, thereby maintaining the impurity concentration profile of the extension region 17e to be steep.

Furthermore, it is possible to suppress the generation of the fixed charge inside the impurity diffusion suppression layer 12 by supplying an impurity such as B, N or F, etc., to the impurity diffusion suppression layer 12 from the impurity supply layer 11.

Second Embodiment

The second embodiment is different from the first embodiment in that the impurity supply layer is formed by an ion implantation procedure. Note that, the explanation will be omitted or simplified for the same points as the first embodiment.

Figure 4A:
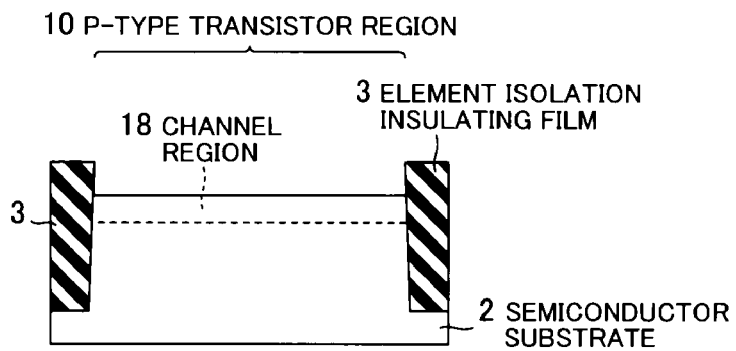
FIGS. 4A to 4C are cross sectional views showing processes for fabricating a semiconductor device according to a second embodiment.
Figure 4B:
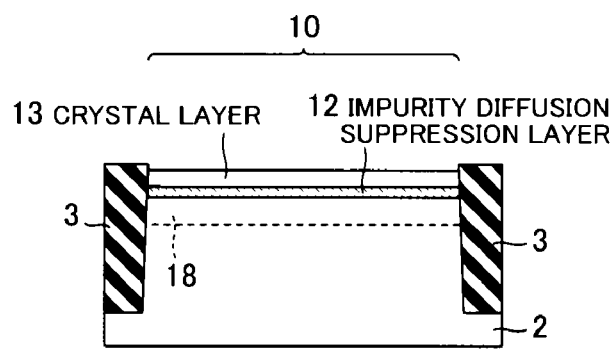
Figure 4C:
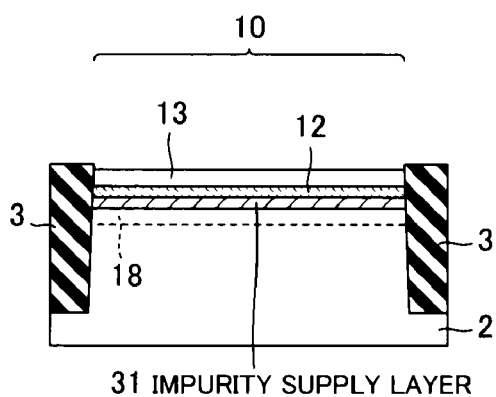

FIGS. 4A to 4C are cross sectional views showing processes for fabricating a semiconductor device according to a second embodiment.

Firstly, as shown in FIG. 4A, the element isolation insulating film 3 is formed in the semiconductor substrate 2 by shallow trench isolation for isolating the p-type transistor region 10 from other elements. Following this, after forming a 10 nm or less thick natural oxide film (not shown), a conductivity type impurity is implanted into a surface of the semiconductor substrate 2 by an ion implantation procedure, which results in that an n-type well (not shown) and the channel region 18 are formed. After that, heat treatment such as RTA, etc., is performed for activating the conductivity type impurity in the n-type well and the channel region 18.

Next, as shown in FIG. 4B, after removing the natural oxide film, the impurity diffusion suppression layer 12 and the crystal layer 13 are formed on the channel region 18 in the p-type transistor region 10.

The impurity diffusion suppression layer 12 is formed by epitaxially growing a Si:C crystal, etc., using semiconductor substrate 2 in the p-type transistor region 10 as a base. In addition, the crystal layer 13 is formed by epitaxially growing a Si crystal, etc., using the impurity diffusion suppression layer 12 as a base.

Next, as shown in FIG. 4C, an impurity such as B, N or F, etc., is introduced into a region of semiconductor substrate 2 under the impurity diffusion suppression layer 12 by the ion implantation procedure, which results in that an impurity supply layer 31 is formed. Concretely, the impurity supply layer 31 is formed by implanting B under a condition at, e.g., an implantation energy of 5 KeV and an implantation dose of $2.0 \times 10^{12}$ cm$^{-2}$. Here, the impurity supply layer 31 has the same function as the impurity supply layer 11 of the first embodiment. Note that, an ion implantation for forming the impurity supply layer 31 may be carried out just before or just after the ion implantation for forming the channel region 18.

After that, the processes after the process, shown in FIG. 3D, for forming the gate insulating film 14 and the gate electrode 15 are carried out in the same way as the first embodiment.
(Effect of the Second Embodiment)

According to the second embodiment, while the impurity supply layer is formed by a method different from that of the first embodiment, it is possible to obtain the same effect as the first embodiment.

Third Embodiment

The third embodiment is different from the first embodiment in that the crystal layer is made of a SiGe crystal. Note that, the explanation will be omitted or simplified for the same points as the first embodiment.

Figure 5:
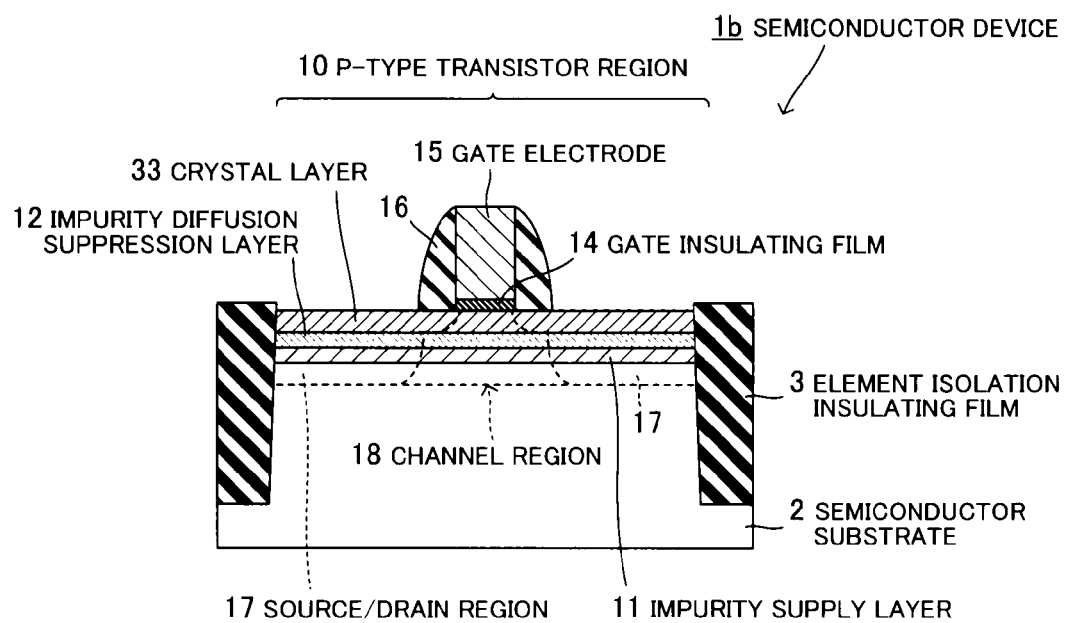
FIG. 5 is a cross sectional view showing a semiconductor device according to a third embodiment.

FIG. 5 is a cross sectional view showing a semiconductor device 1b according to a third embodiment.

In the semiconductor device 1b, a crystal layer 33 is formed instead of the crystal layer 13 of the semiconductor device 1a in the first embodiment.

The crystal layer 33 is made of a SiGe crystal formed by an epitaxial crystal growth method using the impurity diffusion suppression layer 12 as a base.

Although an example of a method of fabricating a semiconductor device according to the present embodiment will be described hereinafter, it is not limited thereto practically.

Figure 6A:
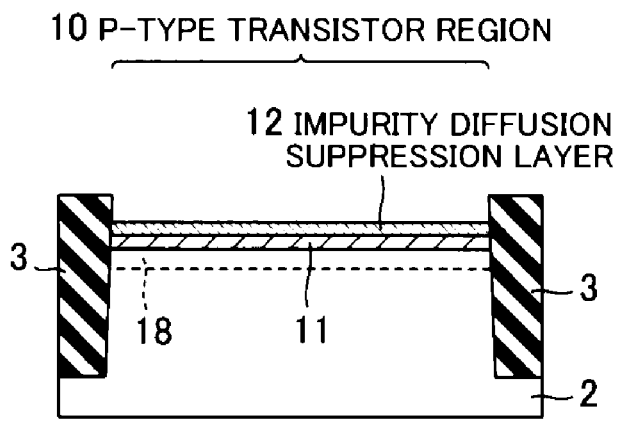
FIGS. 6A to 6C are cross sectional views showing processes for fabricating the semiconductor device according to the third embodiment.
Figure 6B:
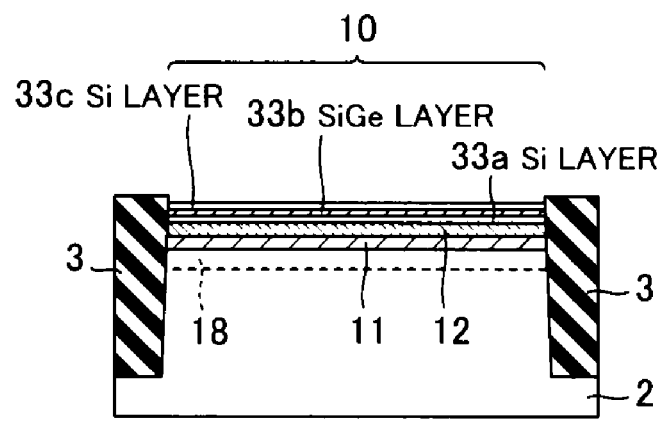
Figure 6C:
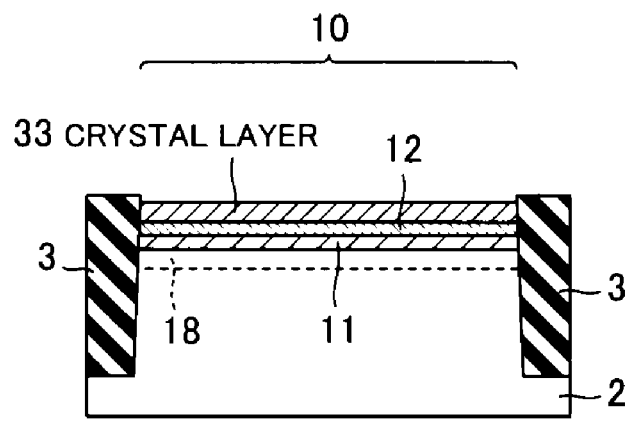

FIGS. 6A to 6C are cross sectional views showing processes for fabricating the semiconductor device according to the third embodiment.

Firstly, the process, shown in FIG. 3A, for forming the element isolation insulating film 3 and the channel region 18 is carried out in the same way as the first embodiment.

Next, as shown in FIG. 6A, after removing the natural oxide film on the upper surface of the semiconductor substrate 2, the impurity supply layer 11 and the impurity diffusion suppression layer 12 are formed in the same way as the first embodiment.

Next, as shown in FIG. 6B, a Si layer 33a, a SiGe layer 33b and a Si layer 33c are laminated on the impurity diffusion suppression layer 12.

The Si layer 33a is formed by epitaxially growing a Si crystal using the impurity diffusion suppression layer 12 as a base. Then, the SiGe layer 33b is formed by epitaxially growing a SiGe crystal using the Si layer 33a as a base. In addition, the Si layer 33c is formed by epitaxially growing a Si crystal using the SiGe layer 33b as a base. Note that, these epitaxial crystal growths are carried out, e.g., in a hydrogen atmosphere under high temperature of 700° C. or more.

Here, a growth condition of the Si layers 33a and 33c is same as that of the crystal layer 13 of the first embodiment. Meanwhile, the SiGe layer 33b is formed using a gas which is a raw material for Ge such as Monogermane (GeH$_4$), etc., in addition to the raw material gas of the Si layers 33a and 33c.

The SiGe layer 33b is formed so that a Ge concentration is 5-40 At %. In addition, the Si layer 33a is formed in a thickness of 2-3 nm, the SiGe layer 33b is formed in a thickness of 5-15 nm and the Si layer 33c is formed in a thickness of 2-3 nm.

After that, as shown in FIG. 6C, Ge in the SiGe layer 33b is diffused into the Si layers 33a and 33c by heat applied in the process of forming an oxide film and the thermal process, which results in that the crystal layer 33 made of a SiGe crystal is obtained. Note that, FIG. 6C is a view schematically showing an aspect that the crystal layer 33 is composed of the Si layer 33a, the SiGe layer 33b and the Si layer 33c, and Ge contained in the SiGe layer 33b may be diffused at any timing for forming the crystal layer 33.

After that, the processes after the process for forming the gate insulating film 14 and the gate electrode 15 are carried out in the same way as the first embodiment.
(Effect of the Third Embodiment)

According to the third embodiment, by using the crystal layer 33 made of a SiGe crystal, it is possible to set the threshold voltage lower than the case of using a crystal layer made of a Si crystal.

Fourth Embodiment

The fourth embodiment is different from the first embodiment in that the semiconductor device has an n-type transistor in addition to a p-type transistor. Note that, the explanation will be omitted or simplified for the same points as the first embodiment, such as the configuration of the p-type transistor region 10, etc.

Figure 7:
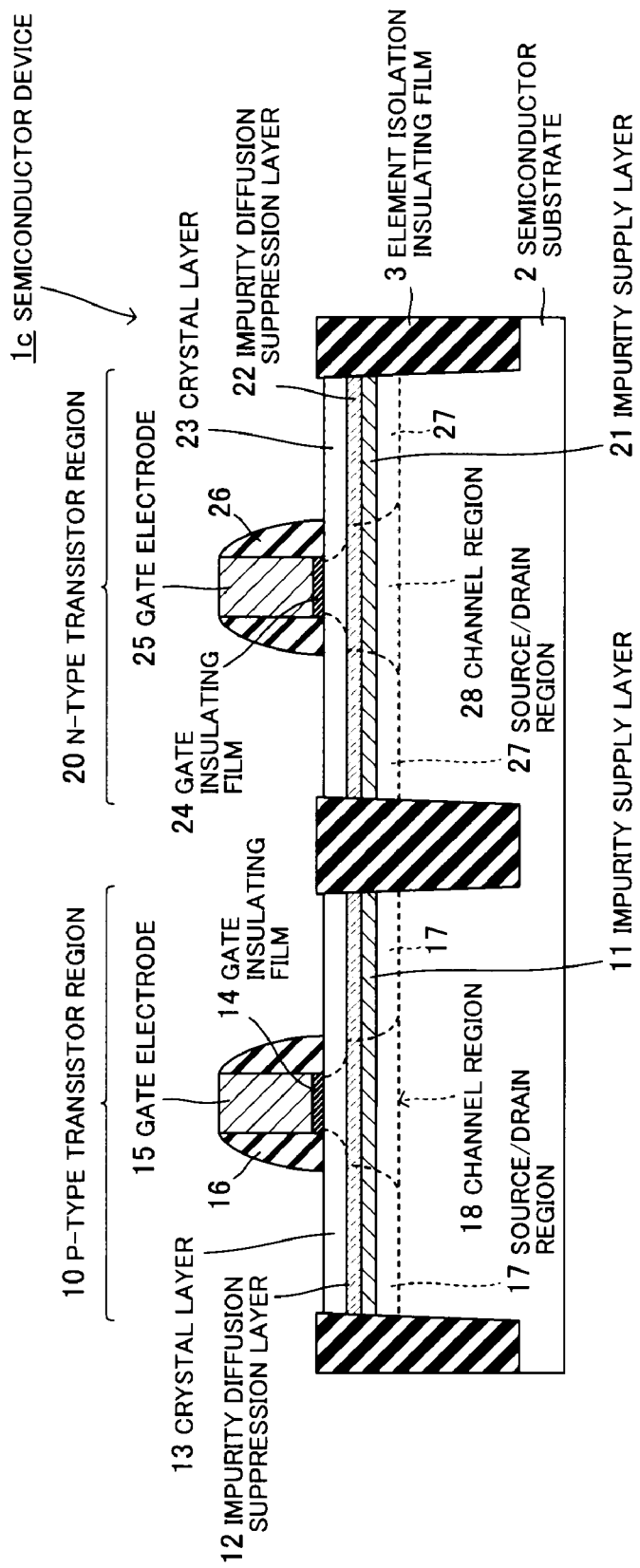
FIG. 7 is a cross sectional view showing a semiconductor device according to a fourth embodiment.
Figure 8A:
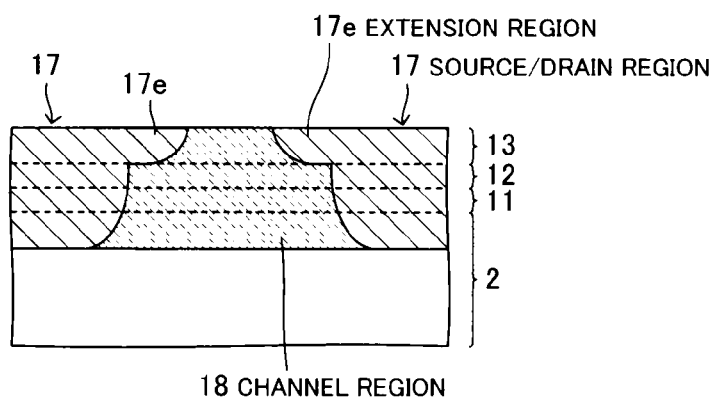
FIGS. 8A and 8B are partial cross sectional views showing a periphery of a channel region in p-type and n-type transistor regions of the semiconductor device according to the fourth embodiment.
Figure 8B:
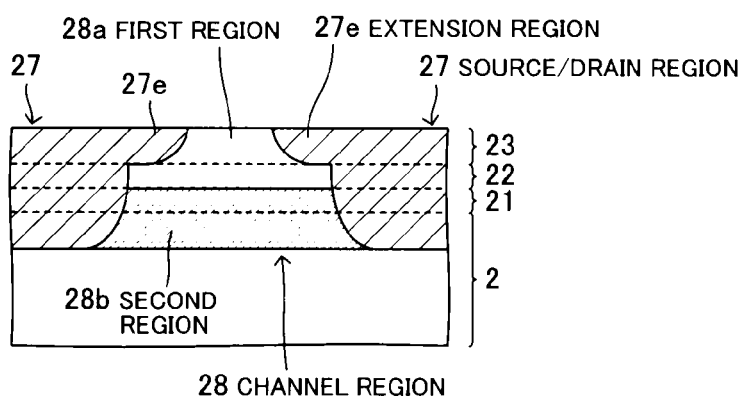

FIG. 7 is a cross sectional view showing a semiconductor device 1c according to a fourth embodiment. In addition, FIGS. 8A and 8B are partial cross sectional views showing respective peripheries of channel regions in p-type and n-type transistor regions 10 and 20.

A semiconductor device 1c according to the present embodiment has a p-type transistor region 10 as well as an n-type transistor region 20 on the semiconductor substrate 2. The p-type transistor region 10 and the n-type transistor region 20 are electrically isolated by the element isolation insulating film 3.

The n-type transistor region 20 includes an impurity supply layer 21 formed on the semiconductor substrate 2, an impurity diffusion suppression layer 22 formed on the impurity supply layer 21, a crystal layer 23 formed on the impurity diffusion suppression layer 22, a gate electrode 25 formed on the crystal layer 23 via a gate insulating film 24, gate sidewalls 26 formed on side faces of the gate electrode 25, source/drain regions 27 formed in the semiconductor substrate 2, the impurity supply layer 21, the impurity diffusion suppression layer 22 and the crystal layer 23 on both sides of the gate electrode 25, and a channel region 28 formed between the source/drain regions 27.

The channel region 28 in the n-type transistor region 20 includes a first region 28a located on the impurity diffusion suppression layer 22 and a second region 28b located under the impurity diffusion suppression layer 22. The second region 28b of the channel region 28 contains a p-type impurity such as B or In, etc., which is implanted for the threshold voltage adjustment, etc. On the other hand, the p-type impurity is contained in the first region 28a at a concentration lower than that of second region 28b, and preferably, the p-type impurity is hardly contained in the first region 28a.

Here, the second region 28b is a region into which a p-type impurity is directly implanted in the fabrication process thereof. On the other hand, the first region 28a is a region into which a p-type impurity is not directly implanted in the fabrication process, thus, the p-type impurity contained in the first region 28a is diffused and migrated from the second region 28b.

The impurity diffusion suppression layer 22 is made of the same material as the impurity diffusion suppression layer 12 in the p-type transistor region 10, and has a property such that diffusion of the p-type impurity such as B or In, etc., contained in the channel region 28 is suppressed inside the impurity diffusion suppression layer 22. Therefore, the diffusion migration of the p-type impurity from the second region 28b to the first region 28a is suppressed by the impurity diffusion suppression layer 22. As a result, the concentration of the p-type impurity contained in the first region 28a becomes lower than that contained in the second region 28b. By decreasing the impurity concentration of the first region 28a sufficiently lower than that of the second region 28b, it is possible to maintain the impurity concentration profile of the channel region 28 to be steep.

The impurity supply layer 21 is made of the same material as the impurity supply layer 11 in the p-type transistor region 10 and can supply an impurity such as B, N or F, etc., to the impurity diffusion suppression layer 22, however, since B is supplied to the impurity diffusion suppression layer 22 from the channel region 28 when the channel region 28 contains B, the generation of the fixed charge in a region of the impurity diffusion suppression layer 22 adjacent to the channel region 28 is suppressed even when the impurity supply layer 21 is not formed. Therefore, the impurity supply layer 21 is not necessarily formed. In this regard, however, since it is necessary to mask the n-type transistor region 20 using a lithography process, etc., in order to selectively form only the impurity supply layer 11 in the p-type transistor region 10, the number of processes is increased. Thus, it is preferable to simultaneously form the impurity diffusion suppression layers 12 and 22.

The source/drain region 27 contains an n-type impurity such as As, etc. In addition, a metal silicide layer containing a metal such as Ni, Co, Er, Pt or Pd, etc., may be formed on an upper surface of the crystal layer 23.

The gate electrode 25 is made of, e.g., a Si-based polycrystal such as polycrystalline silicon, etc., containing an n-type impurity. As or P, etc., is used for the n-type impurity. In addition, a silicide layer containing a metal such as Ni, Co, Er, Pt or Pd, etc., may be formed on an upper surface of the gate electrode 25.

The crystal layer 23, the gate insulating film 24 and the gate sidewall 26 are respectively made of the same materials as the crystal layer 13, the gate insulating film 14 and the gate sidewall 16.

Although an example of a method of fabricating a semiconductor device according to the present embodiment will be described hereinafter, it is not limited thereto practically.

FIGS. 9A to 9F are cross sectional views showing processes for fabricating the semiconductor device 1c according to the fourth embodiment.

Figure 9A:
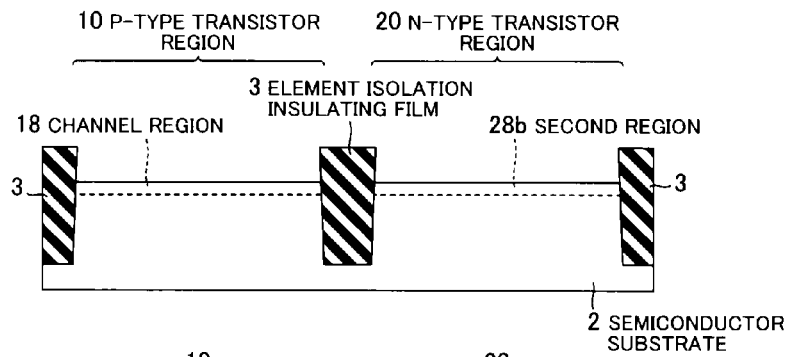
FIGS. 9A to 9F are cross sectional views showing processes for fabricating the semiconductor device according to the fourth embodiment.

Firstly, as shown in FIG. 9A, the element isolation insulating film 3 is formed in the semiconductor substrate 2 by shallow trench isolation for isolating the p-type transistor region 10 from the n-type transistor region 20. Following this, after forming a 10 nm or less thick natural oxide film (not shown) a conductivity type impurity is implanted into a surface of the semiconductor substrate 2 by an ion implantation procedure, which results in that an n-type well (not shown) and the channel region 18 are formed in the p-type transistor region 10 and a p-type well (not shown) and the second region 28b are formed in the n-type transistor region 20. After that, heat treatment such as RTA (Rapid Thermal Annealing), etc., is performed for activating the conductivity type impurity in the p-type well, the n-type well, the channel region 18 and the second region 28b.

Figure 9B:
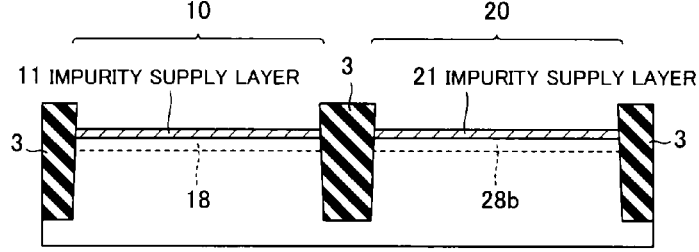

Next, as shown in FIG. 9B, after removing the natural oxide film on the upper surface of the semiconductor substrate 2, the impurity supply layer 11 is formed on the channel region 18 in the p-type transistor region 10 and the impurity supply layer 21 is formed on the second region 28b in the n-type transistor region 20.

The impurity supply layers 11 and 21 are simultaneously formed by epitaxially growing a Si crystal using the surface of the semiconductor substrate 2 as a base while performing in-situ doping of an impurity such as B, N or F, etc.

Figure 9C:
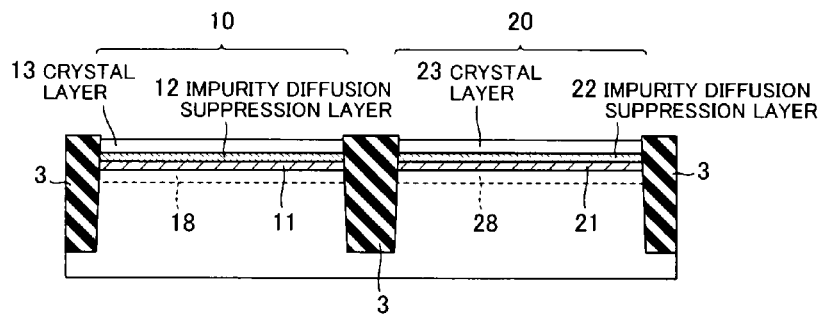

Next, as shown in FIG. 9C, the impurity diffusion suppression layers 12, 22, the crystal layers 13 and 23 are formed on the impurity supply layers 11 and 21, respectively.

The impurity diffusion suppression layers 12 and 22 are simultaneously formed by epitaxially growing a Si:C crystal, etc., using the impurity supply layers 11 and 21 as a base, respectively. In addition, the crystal layers 13 and 23 are simultaneously formed by epitaxially growing a Si crystal, etc., using the impurity diffusion suppression layers 12 and 22 as a base, respectively.

Figure 9D:
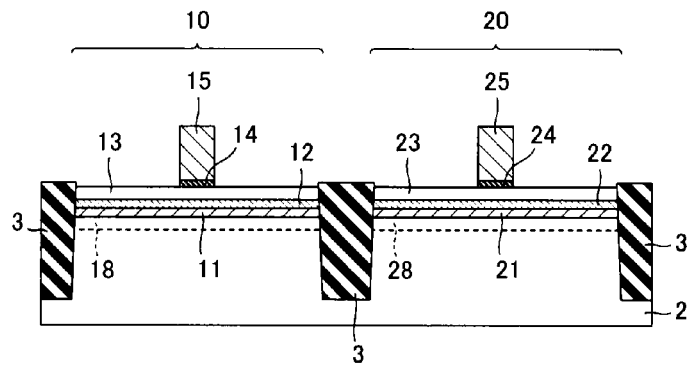

Next, as shown in FIG. 9D, the gate insulating films 14, 24, the gate electrodes 15 and 25 are formed on the crystal layers 13 and 23, respectively.

Figure 9E:
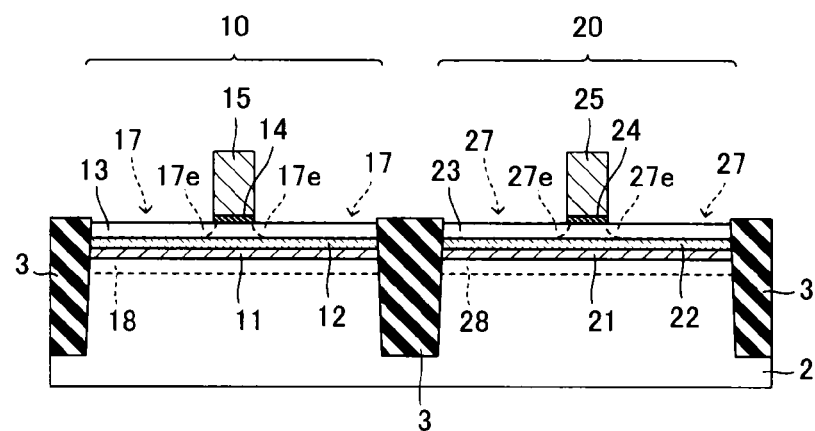

Next, as shown in FIG. 9E, shallow regions of the source/drain regions 17 and 27 including the extension regions 17e and 27e are respectively formed in the crystal layers 13 and 23.

Figure 9F:
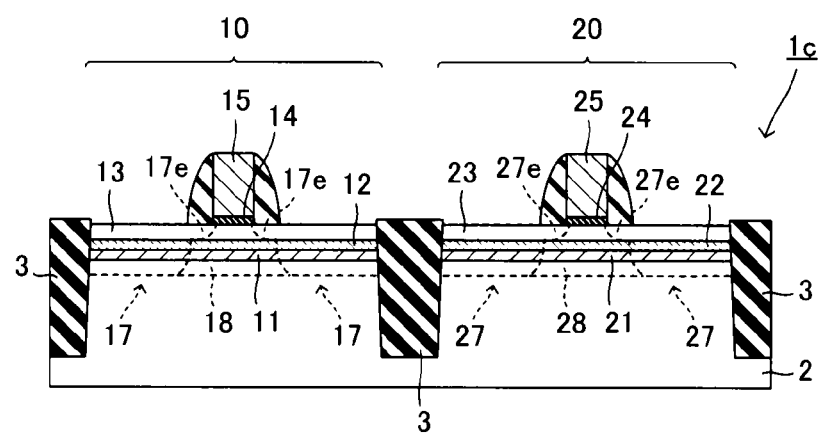

Next, as shown in FIG. 9F, the gate sidewalls 16 and 26 are formed on side faces of the gate electrodes 15 and 25, respectively, and then, a deep high-concentration region of the source/drain region 17 is formed in the semiconductor substrate 2, the impurity supply layer 11, the impurity diffusion suppression layer 12 and the crystal layer 13 in the p-type transistor region 10, and a deep high-concentration region of the source/drain region 27 is formed in the semiconductor substrate 2, the impurity supply layer 21, the impurity diffusion suppression layer 22 and the crystal layer 23 in the n-type transistor region 20. As a result, the semiconductor device 1c shown in FIG. 7 is obtained.

Note that, after this, silicide layers may be formed on exposed portions of upper surfaces of the gate electrodes 15 and 25 and upper surfaces of the crystal layers 13 and 23.

(Effect of the Fourth Embodiment)

According to the fourth embodiment, it is possible to suppress the diffusion of the p-type impurity contained in the extension region 17e of the source/drain region 17 into a lower layer by forming the impurity diffusion suppression layer 12, thereby maintaining the impurity concentration profile of the extension region 17e to be steep.

Furthermore, it is possible to suppress the diffusion of the p-type impurity contained in the second region 28b of the channel region 28 into the first region 28a by forming the impurity diffusion suppression layer 22, thereby maintaining the impurity concentration profile of the channel region 28 to be steep.

Other Embodiments

It should be noted that the embodiment is not intended to be limited to the above-mentioned first to fourth embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device, comprising:
a semiconductor layer formed on a semiconductor substrate;
a gate electrode formed on the semiconductor layer via a gate insulating film;
an impurity diffusion suppression layer formed between the semiconductor substrate and the semiconductor layer and including a C-containing Si-based crystal containing a first impurity including at least boron, the C-containing Si-based crystal being configured to suppress diffusion of a second impurity having a p-type conductivity type and to suppress generation of fixed charge in the C-containing Si-based crystal; and
p-type source/drain regions formed in the semiconductor substrate, the impurity diffusion suppression layer and the semiconductor layer located on sides of the gate electrode, the p-type source/drain region having an extension region in the semiconductor layer and containing the second impurity.

2. The semiconductor device according to claim 1, wherein the first impurity has an atomic radius small enough to enter interstitial regions in a Si-based crystal, and is an element having a property of combining with C.

3. The semiconductor device according to claim 2, wherein the first impurity includes B, N and F.

4. The semiconductor device according to claim 1, wherein an impurity supply layer containing the first impurity is formed under the impurity diffusion suppression layer; and
a peak of a first impurity concentration distribution in the impurity diffusion suppression layer in a region below the gate electrode is below middle of the impurity diffusion suppression layer in a region below the gate electrode in a thickness direction.

5. The semiconductor device according to claim 1, wherein an impurity supply layer containing the first impurity is formed under the impurity diffusion suppression layer, and an impurity concentration distribution of the first impurity has a peak in the impurity supply layer below the gate electrode or in the p-type source/drain regions.

6. The semiconductor device according to claim 4, wherein the first impurity has an atomic radius small enough for being able to penetrate between lattices of a Si-based crystal, and is an element having a property of combining with C.

7. The semiconductor device according to claim 6, wherein the first impurity includes B, N and F.

8. The semiconductor device according to claim 1, wherein the semiconductor layer comprises a Si-based crystal or SiGe crystal.

9. The semiconductor device according to claim 1, wherein a concentration of the first impurity is $5.0 \times 10^{17}$ At/cm$^{-2}$ or more.

10. A semiconductor device, comprising:
a semiconductor substrate having p-type and n-type transistor regions;
a first semiconductor layer formed on the semiconductor substrate in the p-type transistor region;
a first gate electrode formed on the first semiconductor layer via a first insulating film;
an first impurity diffusion suppression layer formed between the semiconductor substrate and the first semiconductor layer and comprising a C-containing Si-based crystal containing a first impurity including at least Boron, the C-containing Si-based crystal being configured to suppress diffusion of a second impurity having a p-type conductivity type and to suppress generation of fixed charge in the C-containing Si-based crystal;
p-type source/drain regions formed in the semiconductor substrate in the p-type transistor region, the first impurity diffusion suppression layer and the first semiconductor layer located on sides of the first gate electrode, the p-type source/drain region having an extension region in the first semiconductor layer and containing the second impurity;
an n-type channel region formed between the p-type source/drain regions;
a second semiconductor layer formed on the semiconductor substrate in the n-type transistor region;
a second gate electrode formed on the second semiconductor layer via a second insulating film;
a second impurity diffusion suppression layer formed between the semiconductor substrate and the second semiconductor layer, and comprising a C-containing Si-based crystal containing the first impurity;
n-type source/drain regions formed in the semiconductor substrate in the n-type transistor region, the second impurity diffusion suppression layer and the second semiconductor layer located on sides of the second gate electrode; and
a p-type channel region formed between the n-type source/drain regions and containing the second impurity, a concentration of the second impurity of the p-type channel region in a region above the second impurity diffusion suppression layer being smaller than that in a region under the second impurity diffusion suppression layer.

11. The semiconductor device according to claim 10, wherein the first impurity has an atomic radius small enough to enter interstitial regions in a Si-based crystal.

12. The semiconductor device according to claim 11, wherein the first impurity includes B, N and F.

13. The semiconductor device according to claim 10, wherein an impurity supply layer containing the first impurity is formed under the first impurity diffusion suppression layer; and
a peak of a first impurity concentration distribution in the first impurity diffusion suppression layer in a region below the first gate electrode is below middle of the first impurity diffusion suppression layer in a region below the first gate electrode in a thickness direction.

14. The semiconductor device according to claim 13, wherein the first impurity has an atomic radius small enough to enter interstitial regions in a Si-based crystal, and is an element having a property of combining with C.

15. The semiconductor device according to claim 10, wherein an impurity supply layer containing the first impurity is formed under the first impurity diffusion suppression layer, and an impurity concentration distribution of the first impurity has a peak in the impurity supply layer below the first gate electrode or in the p-type source/drain regions.

16. The semiconductor device according to claim 10, wherein a concentration of the first impurity is $5.0 \times 10^{17}$ At/cm$^{-2}$ or more.

17. A method of fabricating a semiconductor device, comprising:
forming an impurity supply layer containing a first impurity on a base layer, an impurity diffusion suppression layer comprising a C-containing Si-based crystal on the impurity supply layer and a semiconductor layer on the impurity diffusion suppression layer, the C-containing Si-based crystal being configured to suppress diffusion of a second impurity having a p-type conductivity type and to suppress generation of fixed charge in the C-containing Si-based crystal, the C-containing Si-based crystal including at least boron;
diffusing the first impurity contained in the impurity supply layer into the impurity diffusion suppression layer;
forming a gate electrode on the semiconductor layer via a gate insulating film;
forming extension regions of the p-type source/drain regions containing the second impurity in the semiconductor layer located on sides of the gate electrode; and
forming deep regions of the p-type source/drain regions in the base layer, the impurity diffusion suppression layer and the semiconductor layer on the both sides of the gate electrode.

18. The method of fabricating a semiconductor device according to claim 17, wherein the impurity supply layer, the impurity diffusion suppression layer and the semiconductor layer are continuously formed by epitaxial growth.

19. The method of fabricating a semiconductor device according to claim 17, wherein the impurity supply layer is formed by implanting the first impurity into the base layer using an ion implantation procedure after forming the impurity diffusion suppression layer and the semiconductor layer on the base layer.

20. The method of fabricating a semiconductor device according to claim 17, wherein the semiconductor layer comprises a SiGe crystal, and after depositing a first Si layer, a SiGe layer and a second Si layer on the impurity diffusion suppression layer, the semiconductor layer is formed by diffusing Ge contained in the SiGe layer into the first and second Si layers.

* * * * *